United States Patent
Sharifi Tehrani et al.

(10) Patent No.: US 11,875,868 B2
(45) Date of Patent: *Jan. 16, 2024

(54) QUICK RELIABILITY SCAN FOR MEMORY DEVICE

(71) Applicant: Micron Technology, Inc., Boise, ID (US)

(72) Inventors: Saeed Sharifi Tehrani, San Diego, CA (US); Vamsi Pavan Rayaprolu, San Jose, CA (US)

(73) Assignee: MICRON TECHNOLOGY, INC., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 18/076,225

(22) Filed: Dec. 6, 2022

(65) Prior Publication Data

US 2023/0097679 A1   Mar. 30, 2023

Related U.S. Application Data

(63) Continuation of application No. 17/395,187, filed on Aug. 5, 2021, now Pat. No. 11,545,232.

(51) Int. Cl.
| | | |
|---|---|---|
| *G11C 29/44* | (2006.01) | |
| *G11C 29/12* | (2006.01) | |
| *G11C 16/10* | (2006.01) | |
| *G11C 7/10* | (2006.01) | |
| *G11C 7/20* | (2006.01) | |

(52) U.S. Cl.
CPC ........ *G11C 29/4401* (2013.01); *G11C 7/1063* (2013.01); *G11C 7/20* (2013.01); *G11C 16/102* (2013.01); *G11C 29/12005* (2013.01); *G11C 29/12015* (2013.01)

(58) Field of Classification Search
CPC ..... G11C 29/4401; G11C 7/1063; G11C 7/20; G11C 16/102
See application file for complete search history.

(56) References Cited

U.S. PATENT DOCUMENTS

| | | | |
|---|---|---|---|
| 10,748,588 B2 | 8/2020 | Kim et al. | |
| 11,157,379 B2* | 10/2021 | Pletka | ................... G06F 3/0659 |
| 2016/0202908 A1 | 7/2016 | Lin et al. | |
| 2017/0075812 A1 | 3/2017 | Wu et al. | |
| 2018/0121128 A1* | 5/2018 | Doyle | ..................... G11C 16/10 |
| 2018/0217751 A1 | 8/2018 | Agarwal et al. | |

OTHER PUBLICATIONS

Non-Final Office Action, U.S. Appl. No. 17/395,187, dated May 25, 2022, 12 pages.
Notice of Allowance, U.S. Appl. No. 17/395,187, dated Sep. 14, 2022, 10 pages.

* cited by examiner

*Primary Examiner* — Han Yang
(74) *Attorney, Agent, or Firm* — NICHOLSON DE VOS WEBSTER & ELLIOTT LLP

(57) ABSTRACT

Technologies for performing a quick reliability scan include, for a particular block of a set of blocks of different block types, each block of the set of blocks including pages of memory of a physical memory device, identifying subset of the pages of the block. The block is scanned by scanning the subset of the plurality of pages of the block for a fold condition. A page of the subset of the plurality of pages is determined to have the fold condition. After the set of blocks has been scanned, the folding of the block that includes the page that has been determined to have the fold condition is requested.

20 Claims, 6 Drawing Sheets

QUICK RELIABILITY SCAN FOR MEMORY DEVICE

CROSS-REFERENCE TO RELATED APPLICATION

The present application is a continuation of U.S. patent application Ser. No. 17/395,187 filed Aug. 5, 2021, which is hereby incorporated by reference.

TECHNICAL FIELD

The present disclosure generally relates to memory data integrity scans, and more specifically, relates to quick reliability scans for a memory device.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
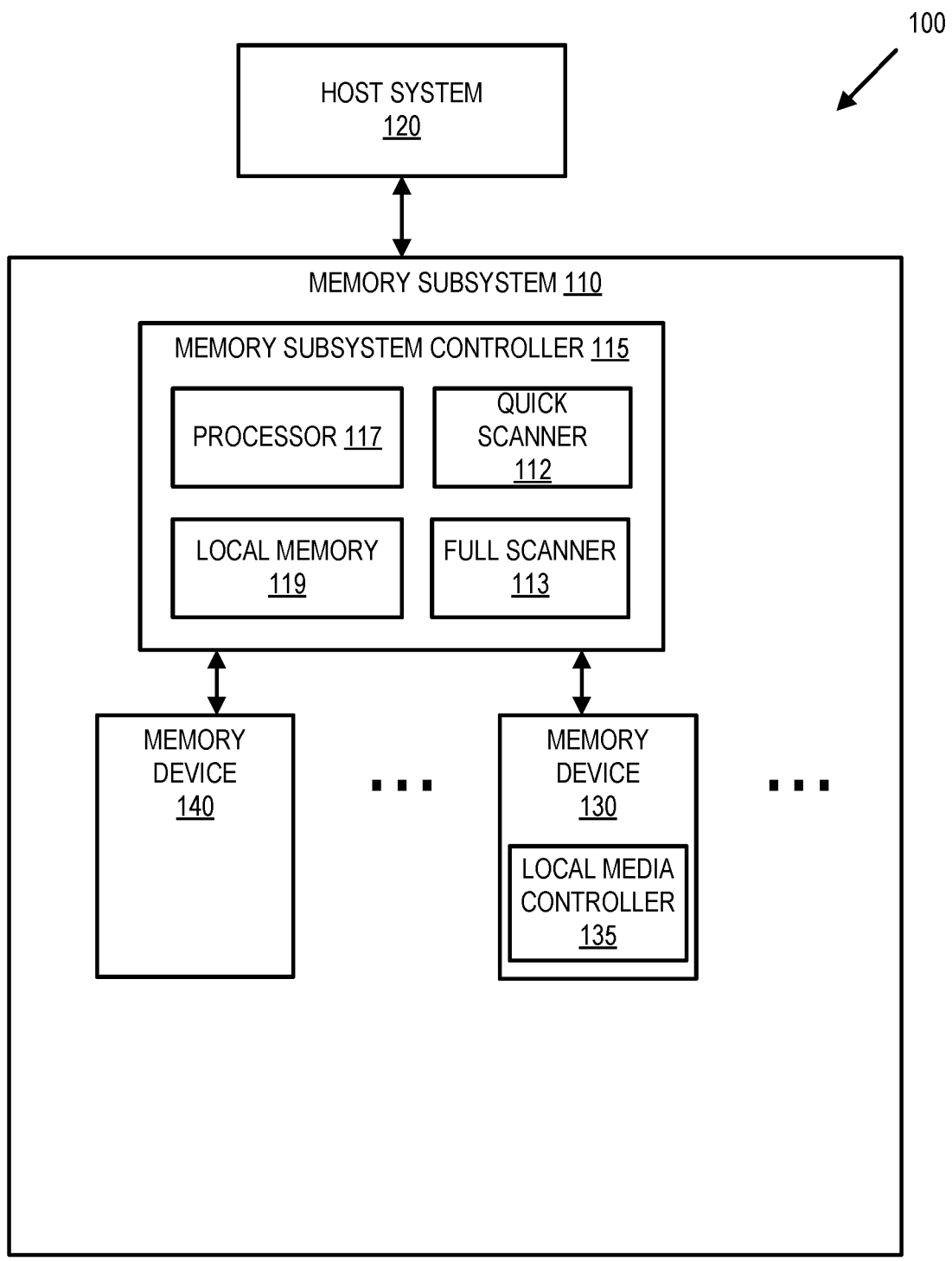
FIG. 1 illustrates an example computing system that includes a memory subsystem in accordance with some embodiments of the present disclosure.

Aspects of the present disclosure are directed to a quick reliability scan in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

A media scan or integrity scan is an at least partially automated process by which a memory subsystem assesses the health of a memory device and causes blocks to be folded by the memory device. Folding refers to an at least partially automated process by which the memory subsystem moves valid data stored in a block that has become unhealthy to another, healthier block. After a fold operation, the valid data is stored in the healthier block instead of the unhealthy block.

Approaches to ensuring media integrity include conducting a full media scan ("full scan"), which entails scanning of an entire memory device. During a full scan, a memory subsystem evaluates one or more health indicators for each and every page of each and every block of the memory device, without skipping any pages or blocks. Additionally, during the full scan, blocks are folded on-the-fly as soon as they have been scanned and determined to be unhealthy (e.g., satisfying a threshold bit error rate). As a result, full scans can be extremely time consuming. In some usage cases, a full scan can take too long to complete for practical use—e.g., on the order of months.

Reliability is an example of a health indicator for a memory device. Reliability refers to the extent to which a memory device is capable of correctly reading data that has been previously written to the memory device. Reliability of a memory device can degrade as more bits are programmed per cell, for example. Program, programming, or programmed as used herein means that the memory subsystem has written data to a particular unit of memory, such as a bit, a cell, a page, or a block. If data has not been written to the unit of memory, the unit of memory can be referred to as empty. A unit of memory can be referred to as partially programmed when the unit of memory has been allocated for data storage, but the memory subsystem has not yet written data to that unit of memory, or if the unit of memory has some valid data written to it but is still partially empty.

Reduced reliability of a memory device can result from a disturbance known as read disturb. A read disturb error occurs when a read to one row of cells impacts the threshold voltages of unread memory cells in different rows of the same block. These disturbances can shift the threshold voltages of the unread cells to different logical states than the originally programmed states, which can cause read errors. Any reference to a threshold value herein can refer to, for example, a parameter value that is set based on the requirements of a particular design or implementation of the memory device or the computing system, for example as the result of experimentation or operational testing.

Data retention is an example of a metric that can be used to test for reliability of a memory device. In certain usage scenarios, a full media scan cannot practically satisfy data retention requirements or otherwise ensure reliability of the memory device because the full scan takes too long to complete. In other usage scenarios, the full scan is unable to satisfy memory device testing requirements, such as power cycle test (PCT) requirements, because performing the full scan takes too much time and/or introduces latent read disturb errors.

Examples of usage scenarios in which full media scans cannot consistently ensure reliability of a memory device in a practical/useful manner include short power-on usage cases, long power-off usage cases, and large cross-temperature usage cases.

Aspects of the present disclosure address the above and other deficiencies by configuring a memory subsystem to perform a quick reliability scan ("quick scan") of a memory device. As described in more detail below, the quick scan can be completed by the memory subsystem within a much shorter time interval than the full media scan because the quick scan only scans a subset of the pages of each block, identifies blocks for folding based on only the results of the scans of the identified subsets of pages, and defers the folding of blocks until after all blocks of the memory device have been scanned by the quick scan. Additionally, folding is not initiated while the quick scan is in progress. Instead, folding is initiated after the quick scan is complete.

Because the quick scan only scans a subset of the pages of a block, references to scanning a block in the context of the quick scan refers to scanning a subset of the pages of the block. Subset as used herein refers to less than all pages of a block. The number of pages in a subset of pages of a block to be scanned can be much smaller than the total number of pages in the block. For example, the quick scan might scan only 4-5 pages, or less, of a 2,000-page block. Thus, subset as used herein can refer to a non-zero number of pages that account for less than 1% of the pages of a block, or less than 0.1%, or less than 0.001%, of the pages of a block. Stated another way, the fraction of total pages of a block scanned by the quick scan can be in the range of about $5/2000$ or less.

The quick scan can be triggered by the occurrence of an event, such as a power-on condition. For example, the start of a quick scan can be delayed until after the completion of a power cycle test. After the quick scan has finished, the memory subsystem can initiate block folding and a full media scan can be initiated, resumed, or otherwise conducted. In this way, the folding of blocks that have been identified by the quick scan can proceed concurrently or in parallel with the full media scan once the quick scan has finished. Block folding can be initiated by, for example, the memory subsystem sending a request to the host or to a local media controller.

An example benefit of the disclosed technologies is that a memory subsystem can quickly scan a memory for reliability issues as part of or immediately following a power-up of a device in which the memory is embedded. In an automobile, for example, the quick reliability scan can help prevent data loss and ensure that data needed by the automobile for proper operation, such as navigation data and network connectivity information, can be read correctly from the memory device before the automobile is put in motion. An automobile is just one use case provided for illustrative purposes. The disclosed technologies are applicable to many other use cases, such as any device or system that is susceptible to one or more of the usage scenarios described herein.

Examples of usage scenarios in which the quick scan can improve the reliability of a memory device include short power-on usage cases, long power-off usage cases, and large cross-temperature usage cases. An example of a short power-on usage case is a machine that is only used for small amounts of time interspersed with much longer periods of non-use. An automobile that is only driven for a few minutes a day is an example of a short power-on usage scenario. An example of a long power-off usage case is a machine that is typically used on regular, periodic intervals but occasionally sustains long periods of non-use. An automobile that is typically used for daily commuting, but which is occasionally left parked at an airport or garage for several days is an example of a long power-off scenario. An example of a large cross-temperature usage case is a machine that is operated over a wide range of operating temperatures. Automobiles and other machines that are used in outdoor environments can be subjected to a large range of operating temperatures from very cold to hot. Fluctuation across such temperature extremes can affect the reliability of memory devices used in those machines.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random-access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory device 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory device 130 and/or the memory device 140 include(s) a local media controller 135 that operates in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a quick scanner component 112 that can perform a quick scan of the memory device 130 and/or the memory device 140, as well as a full scanner component 113 that can perform a full scan of the memory device 130 and/or the memory device 140. In some embodiments, the controller 115 includes at least a portion of the quick scanner component 112. For example, the controller 115 can include a processor 117 (processing device) configured to execute instructions stored in local memory 119 for performing the operations described herein. In some embodiments, a quick scanner component 112 is part of the local media controller 135, the host system 120, an application, or an operating system.

The quick scanner component 112 can perform a quick reliability scan of a memory device, such as the memory device 130 and/or the memory device 140, which defers block folding until after the quick scan has finished. Further details with regards to the operations of the quick scanner component 112 are described below.

FIG. 2, FIG. 3, FIG. 4, and FIG. 5 each illustrate an example configuration of a memory after a particular phase of a quick reliability scan in accordance with some embodiments of the present disclosure. While the description of the quick scan is divided into multiple phases, multiple phases are not required. For example, any two or more of the phases described below could be combined into a single phase or any phase can be divided into multiple additional phases. Alternatively or in addition, the phases could be defined differently; for example, different operations could be included in different phases.

Figure 2:
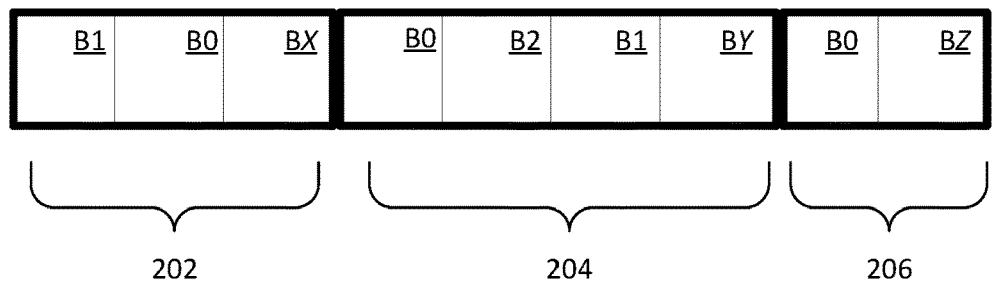
FIG. 2, FIG. 3, FIG. 4, and FIG. 5 each illustrate an example configuration of a memory after a phase of a quick reliability scan in accordance with some embodiments of the present disclosure.

FIG. 2 illustrates a result of a block grouping phase of a quick reliability scan in which the memory subsystem groups blocks of memory into N block groupings, where N is a positive integer, according to a block grouping criterion. The block grouping criterion can be or correspond to a particular retention risk factor. For example, FIG. 2 shows three block groupings 202, 204, 206, where each grouping includes one or more blocks that have been determined to have a block grouping criterion in common. Block grouping 202 includes X blocks, where X is a positive integer. Block grouping 204 includes Y blocks, where Y is a positive integer. Block grouping 206 includes Z blocks, where Z is a positive integer. Each or any one or more of N, X, Y, and Z can have the same value or a different value.

An example of a block grouping criterion is block type. Different types of blocks can have characteristics that correspond to different levels of data retention risk. For example, open-cursor blocks can be said to have higher levels of retention risk than other types of blocks because open-cursor blocks are next to be written with host data, can be partially programmed, and can be written following confirmation of data reliability. As another example, TLC blocks can have higher retention risk than SLC blocks and/or firmware blocks (blocks that store only firmware data) but lower retention risk than open-cursor blocks. Similarly, firmware blocks can have higher retention risk than SLC blocks but lower retention risk than TLC blocks and open cursor blocks. Examples of firmware block types include image, Firmware Static Allocation, table, and swap. Other examples of block types include pre-erased blocks, TLC data blocks, SLC blocks that are not open-cursor blocks or pre-erased blocks, and other blocks that are not included in any of the foregoing block types. The example block types mentioned herein are not necessarily mutually exclusive. For example, an SLC block can be an open-cursor block or a pre-erased block, and open-cursor blocks can be SLC and/or TLC blocks.

Determining whether blocks have, match, or satisfy the block grouping criterion can include classifying the blocks into different block types based on one or more characteristics of the blocks. The characteristics of a particular block can change over time. For example, dynamic blocks can be used in an SLC mode or a TLC mode. Thus, a block's block type can be determined by the memory subsystem reading block characterization data stored, for example, in local memory 119. For example, the memory subsystem can maintain a mapping of block usage to block type data, which it can read to determine the block type.

In FIG. 2, the block type groupings 202, 204, 206 are arranged in a priority order for processing by the quick reliability scan. For example, block type 202 has a higher priority than block type 204 and block type 204 has a higher priority than block type 206. Block type priority can correspond to retention risk. For example, the memory subsystem can assign a higher priority to block types that are associated with higher retention risk and lower priority to block types that have lower retention risk. Blocks with a higher priority are processed by the quick scan example of a priority order of for block types is shown in Table 1 below.

TABLE 1

Example Block Type Order.

| Block Type | Priority (from highest to lowest) |
|---|---|
| Open cursor blocks and pre-erased blocks | 1 |
| TLC data blocks | 2 |
| Firmware blocks | 3 |
| All other SLC blocks | 4 |

Block types and their associated priorities are determined based on the requirements of a particular design or implementation of the memory subsystem or the computing system. For example, block type designations other than the examples mentioned in this disclosure can be used, and block type priorities can be adjusted for different block type designations or more generally, for different configurations of the computer system.

Also in FIG. 2, the blocks within each of the block type groupings 202, 204, 206 are sorted by a block type sort criterion. The block type sort criterion can be or correspond to another retention risk factor. An example of a block type sort criterion or risk factor by which the blocks within a particular block grouping can be sorted is block age. To determine the age of a particular block (or the data written to that block), the memory subsystem can read block version data from memory and sort the blocks in the block grouping based on the block version data. Block version data indicates the date/timestamp of the last (most recent previous) time the block was programmed. Alternatively or in addition, block age can be determined based on the program/erase (PE) count for the block. For example, blocks can be sorted in descending order based on a value that relates to the number of PE cycles. In some embodiments, the blocks within each block type grouping are sorted by version in descending order so that the quick scan will scan the oldest blocks (i.e., the blocks for which the longest amount of time has elapsed since the blocks were last programmed) first.

An alternative to sorting blocks by age is for the memory subsystem to sort the blocks by slow charge loss (SCL) bin. For example, the memory subsystem can sort the blocks of a block grouping by SCL bin in descending order from highest to lowest SCL bin. SCL bin data can be produced by, for example, a memory management process that runs on the memory device and dynamically assigns blocks to SCL bin numbers based on data retention risk, where the bin number correlates with data retention risk. For example, blocks assigned to an SCL bin number 1 can have the highest data retention risk, while blocks assigned to SCL bin number 2 have lower data retention risk than blocks in SCL bin number 1, and so on.

Data retention risk changes over time; thus, the assignments of blocks to SCL bins can change over time. To obtain the SCL bin data, the memory subsystem can sample SCL bin data output by the memory management process that dynamically assigns blocks to SCL bins, or the memory subsystem can read the SCL bin data from memory.

Another alternative for arranging the blocks within a block grouping that can be used by the memory subsystem is to arrange the blocks in a random order within the block grouping. Still another alternative is for the memory subsystem to arrange the blocks within a block grouping in numerical order by block identifier or block number.

In FIG. 2, the blocks in block grouping 202 are not arranged in block number order (because B1 is positioned before B0) but are sorted by some other criterion. For example, the blocks of block grouping 202 are sorted by block age/version, SCL bin number, or are arranged randomly. Similarly, the blocks in block grouping 204 are not arranged in block number order (B2 is positioned between B0 and B1) but are sorted by some other criterion. For example, the blocks of block grouping 204 are sorted by block age/version, SCL bin number, or are arranged randomly. In some embodiments, the block sort criteria can vary by block type. For example, the blocks in block grouping 202 could be sorted by block age/version while the blocks in block grouping 204 are sorted by SCL bin number.

Figure 3:
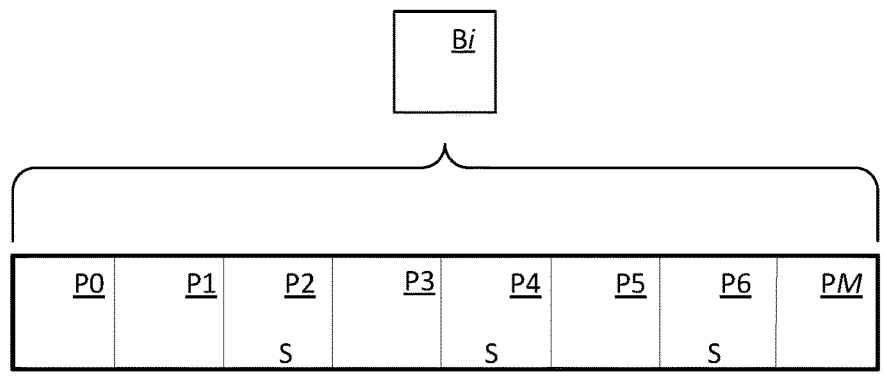

FIG. 3 illustrates a result of a second phase of a quick reliability scan in which the memory subsystem identifies one or more pages of a block Bi for scanning by the quick scan, where i is a positive integer, based on a page scanning criterion or risk factor. Block Bi is a particular block of one of the block groupings 202, 204, 206 of FIG. 2. Block Bi contains M pages, where M is a positive integer. In FIG. 3, "S" denotes pages that have been identified for scanning. That is, the memory subsystem has identified pages P2, P4, and P6 for scanning but has not identified any of the other pages for scanning by the quick scan. As such, only pages P2, P4, and P6 of block Bi will be scanned by the quick scan. The "S" demarcation is for illustrative purposes only and does not indicate a literal storing of an "S" value in memory.

The memory subsystem identifies a number of particular pages of a block for scanning by the quick scan. The number of pages in the subset, i.e., the size of the subset, can be determined based on the page scanning criterion, which can be or relate to a value of, for example, NAND characterization data for the block. To do this, the memory subsystem can read the NAND characterization data from memory and map the NAND characterization data to a subset size. For example, if the memory subsystem determines that the NAND characterization data for a particular block indicates that the block has a higher retention risk (e.g., by comparing the block's current NAND characterization data to a threshold value and determining that the current NAND characterization data meets or exceeds the threshold value), the memory subsystem selects/uses a larger subset size than if the memory subsystem determines that the NAND characterization data indicates that the block has a lower retention risk (e.g., by determining that the block's current NAND characterization data does not meet or exceed the threshold value). Thus, for example, the subset size could be 5/2000 pages if the block has a higher retention risk and 2/2000 pages if the block has a lower retention risk. The subset size can be encoded as a parameter value that can be set for a particular block, for all blocks in a particular block grouping, or for all blocks of the memory device.

Alternatively, particular pages can be identified for scanning by the quick scan based on a page scanning criterion that includes NAND characterization data for the individual pages. To do this, the memory subsystem can read the NAND characterization data for a particular page from memory and compare the NAND characterization data for the page to a threshold value. If the NAND characterization data for a page exceeds the threshold value, the page can be identified for scanning.

Examples of NAND characterization data include indicators of the quality of different pages in different blocks. An example of a page quality indicator is data retention sensitivity. For example, the memory subsystem can compare data retention sensitivity across different wordlines and select pages for inclusion in the subset of pages to be scanned based on the data retention sensitivity of its wordline relative to the data retention sensitivity of other wordlines. Stated another way, the memory subsystem can include in the subset of pages to be scanned a page from a wordline that has the highest data retention sensitivity of all the wordlines. The memory subsystem can perform the identifying high data retention sensitivity wordlines and selecting pages from those wordlines as a separate process, i.e., independently of the quick scan. For instance, page identifying information can be pre-determined based on wordline data retention sensitivity and passed to the quick scan as parameter value(s).

Figure 4:
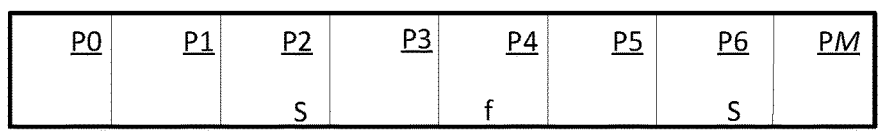

FIG. 4 illustrates a result of a third phase of a quick reliability scan in which the memory subsystem scans only the pages in the subset of pages identified for scanning in the second phase of the quick scan, e.g., pages P2, P4, P6, for a particular block of a particular block type. FIG. 4 shows that page P4, which was identified for scanning as shown in FIG. 3, has been scanned and determined to have a fold condition, while pages P2 and P6 have been scanned but determined not to have the fold condition, and pages P0, P1, P3, P5, and PM have not been scanned at all by the quick scan. While FIG. 4 shows only one of the pages P2, P4, P6 being determined to have the fold condition, any one or more of the pages in the subset of pages that have been identified for scanning could be determined to have a fold condition in other examples. In FIG. 4, the "f" demarcation is for illustrative purposes only and does not indicate a literal storing of an "f" value in memory.

Determining that a page has/satisfies a fold condition does not involve executing a folding operation. Adding a block to a fold list when the block contains a page that has a fold condition (or otherwise flagging the page/block for folding) also does not involve executing a folding operation. Instead, blocks that have one or more pages that have been determined to have a fold condition are not folded until after the quick scan is done.

To determine whether a page has a fold condition, the memory subsystem evaluates a page retention criterion or risk factor by comparing a current value of the page retention criterion to a threshold value for the page retention criterion. Examples of data that can be used as the page retention criterion or risk factor include retention risk metrics such as residual/raw bit error rate (RBER), ARC (auto read calibration) RBER, threshold voltage (Vt) distribution shape, Vt shift, and erase state. The data used as the page retention criterion can vary based on whether the page is programmed or empty. That is, either or both empty pages and programmed pages can be scanned by the quick scan, and different page retention criteria can be used for programmed pages versus empty pages.

If the page is empty, the memory subsystem can determine whether the empty page has a fold condition by testing the erase state of the empty page. For example, the memory subsystem can compare a current erase state value for a particular empty page to a threshold value or determine the difference between the current erase state value and a previously measured erase state value determined at an earlier point in time. If the current erase state value or the change in the erase state value over time satisfies the threshold value (e.g., meets or exceeds the threshold value), the block containing the empty page can be marked and added to the fold list (without executing the folding, yet). If the current erase state does not satisfy the threshold value, the quick scan can proceed to scan the next page in the subset of pages to be scanned for that block or proceed to scan the next block.

If the page is programmed, the memory subsystem can check the current values of one or more different retention metrics as described above. For example, the memory subsystem can check the current value of the RBER by comparing the current value of the RBER to a RBER threshold value. If the current value of the RBER is less than the RBER threshold value (or otherwise does not satisfy the threshold value), the page can be skipped, i.e., determined not to have a fold condition.

If the current value of the RBER satisfies (e.g., meets or exceeds) the RBER threshold value, the memory subsystem can perform one or more additional tests on the page. For example, the memory subsystem can execute an auto read calibration (ARC) on the page after executing the RBER test on that page. An example of an ARC is the memory subsystem moving a read voltage position on the memory, executing a read operation from the new position, and then measuring the RBER after the read operation. If the current ARC RBER value does not satisfy/is less than an ARC RBER threshold value, the programmed page can be skipped, i.e., determined not to have the fold condition. If the current ARC RBER value satisfies (e.g., meets or exceeds) the ARC RBER threshold value, the block containing that programmed page is marked and added to the fold list (but not folded yet).

In the RBER test and/or the ARC RBER test, the RBER values can be computed at the page level or by codeword, for example. An RBER value can be obtained from the memory subsystem's decoder, which can report the RBER value to the memory subsystem. Threshold RBER values can be determined based on characterization studies in which the memory device is tested under various different operating conditions. Alternatively, threshold RBER values can be determined based on the type of encoding or decoding used in the memory subsystem, which indicates the level of error correction capabilities of the memory device. For example, a memory subsystem designed with a more complex decoding process might tolerate higher RBER levels that enable higher RBER thresholds to be used.

As an alternative or in addition to evaluating the RBER and ARC RBER values, a voltage distribution of a read write operation on a page or block can be used to test for data retention risk of the particular page or block. For example, the memory subsystem can monitor changes in the shape (e.g., histogram) of the voltage distribution or the amount by which the voltage distribution shifts on the x-axis over time as a signal of retention risk. If the change in shape of the voltage distribution satisfies (e.g., meets or exceeds) a threshold value or the shift in the voltage distribution satisfies a threshold value, the memory subsystem can determine that the page has the fold condition and add the block to the fold list.

To add a block to the fold list, the memory subsystem can mark the block by changing the value of a bit, e.g., a flag variable, in memory. For example, changing a bit value from 0 to 1 can indicate that a block has been added to the fold list.

For pages that are programmed, using at least two different tests to determine whether to mark the block containing the page that has the fold condition for folding can help reduce the number of blocks that are marked for folding. For example, if only the RBER test is used, it is possible that all blocks on the memory device could be marked for folding. Using at least a second test, such as the ARC RBER test, reduces the number of blocks that need to be marked for folding. Marking a block for folding can involve changing the value of a flag variable; e.g., flipping the value of a bit from 0 to 1 or vice versa. Therefore, reducing the number of blocks that are marked for folding can reduce the number of bits that are flipped; thereby increasing the likelihood that the quick scan can run more efficiently. Additionally, because the fold operation is computationally expensive, using at least two different tests to evaluate pages can reduce the number of blocks on the fold list and thereby reduce the number of fold operations performed after the completion of the quick scan.

A time limit for completion of the page selection and page scanning phases of the quick scan can be specified, e.g., by setting a parameter value that is included in an instruction to the memory subsystem. The memory subsystem can monitor the elapsed clock time in comparison to the time limit and adjust the priority of the quick scan and/or one or more other processes that can be running concurrently with the quick scan in order to ensure that the page selection and page scanning phases of the quick scan finish within the time limit. For example, the memory subsystem can run the quick scan in the foreground and/or suspend a background process to free up computational resources for the quick scan.

Once all the pages identified for scanning for a particular block have been scanned, and that block is either added to the fold list or not added to the fold list, the quick scan performs a similar set of operations for the next block of the block type grouping. Once all blocks of a particular block type grouping are scanned, the quick scan performs a similar set of operations for the blocks of the next block type. The quick scan continues to scan blocks in the order in which the blocks have been arranged by the block type grouping and block sorting operations described earlier. Once all block types are scanned, the quick scan ends. After the quick scan ends, the memory subsystem initiates a full scan and pushes the blocks marked for folding in the fold list for immediate folding.

Figure 5:
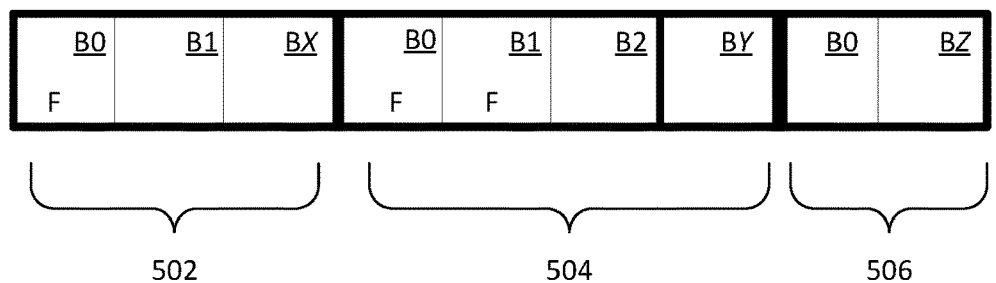

FIG. 5 illustrates a result of a fourth phase of a quick reliability scan in which each block that contains at least one page that has a fold condition is added to a fold list. Whereas FIG. 4 illustrates a determination that, for any block Bi, at least one page of that block Bi has a fold condition, FIG. 5 illustrates blocks that have been added to the fold list as a result of the type of determination illustrated by FIG. 4. Thus, in FIG. 5, block B0 of block grouping 202 and blocks B0 and B1 of block grouping 204 have been added to the fold list while none of the other blocks have been added to the fold list. As noted above, adding a block to a fold list does not include executing a fold operation on that block. The memory subsystem initiates folding of blocks that have been add to the fold list after the quick scan is complete.

In some embodiments, the quick scan can skip the scanning of certain pages and/or blocks to further improve efficiency. For example, if block groupings and their respective blocks are arranged in an order of decreasing retention risk, then when a block of a particular block grouping has been marked to be added to the fold list, the quick scan can skip the scanning of the remaining unscanned blocks in that block grouping and proceed to scan the next block grouping in retention risk order. Also, a block can be added to the fold list as soon as one page of that block is determined to have a fold condition, such that scanning of the remaining unscanned pages of that block can be skipped by the quick scan. Additionally, if the quick scan determines that the oldest block in the memory (as determined by, e.g., block version or SCL bin), does not need to be folded, the quick scan can end without scanning the remaining, younger, unscanned blocks.

Examples of parameters described herein include a quick scan start time, quick scan pages, a quick scan frequency (freq), a quick scan RBER threshold, and a quick scan ARC RBER threshold. The values of these and/or other parameters are tunable or configurable based on the requirements of a particular design or implementation of the memory device or the computer system. For example, quick scan start time can refer to a trigger time, e.g., in milliseconds, after which the quick scan starts; as such, the value of quick scan start time can be determined based on the duration of system power-up operations such as PCT tests, for example. Similarly, quick scan pages can refer to the size of a subset of pages to be sampled for scanning, per block; as such, the value of quick scan pages can vary based on the current characterization data and/or current cell mode, for example.

Quick scan freq refers to a time limit, e.g., in milliseconds, for performing the quick scan. Quick scan freq can be calculated based on the number of blocks in the memory device and the value of quick scan pages. For example, if a memory device has 500 blocks and the value of quick scan pages=2 pages per block, and there is a requirement to complete the quick scan in one minute, then quick scan freq=(500*2)/60 seconds. The value of quick scan freq can vary based on the type of memory device, the number of blocks, the number of pages per block, and/or other characteristics of the memory device. Quick scan RBER threshold and quick scan ARC RBER threshold can refer to threshold values, in bit error count, that can be used by the quick scan to determine whether to add a block to a fold list (without actually folding the block until folding is triggered following the quick reliability scan). These threshold values can vary based on block type. For example, RBER threshold values for TLC blocks can be higher than RBER threshold values for QLC blocks. Alternatively or in addition, RBER threshold values can be a function of the program erase (PE) cycle of a block.

Figure 6:
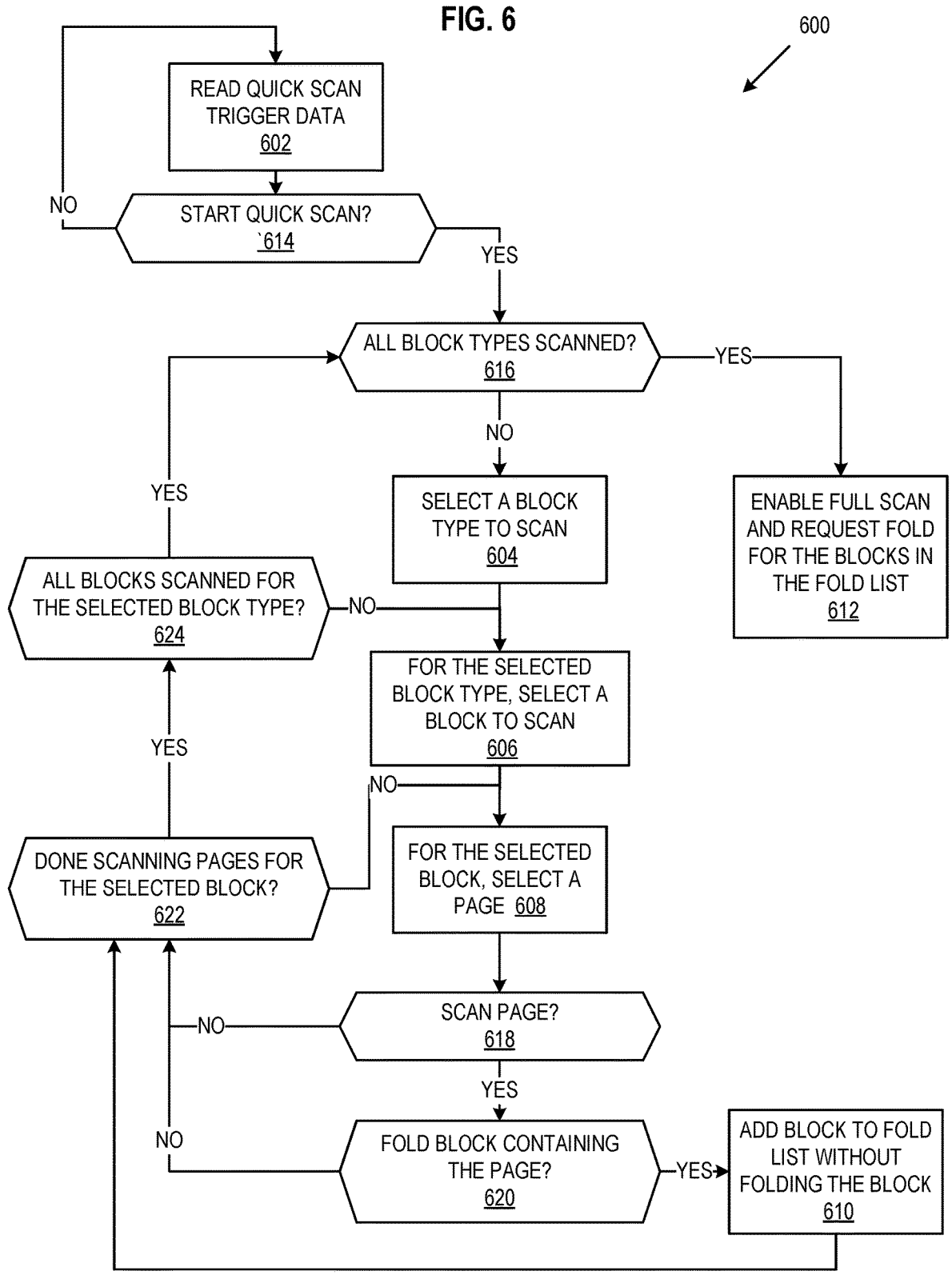
FIG. 6 is a flow diagram of an example method to execute a quick reliability scan for memory in accordance with some embodiments of the present disclosure.

FIG. 6 is a flow diagram of an example method 600 to perform a quick reliability scan of a memory device, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the quick scanner component 112 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 602, the processing device reads quick scan trigger data. An example of quick scan trigger data is quick scan start time. Another example of quick scan trigger data is detection of the occurrence of an event, such as completion of a power cycle test.

At operation 614, the processing device determines whether to start executing a quick scan. To do this, the processing device evaluates the quick scan trigger data read in operation 602. For example, the processing device compares the value of the quick scan start time to a current elapsed clock time since power-up of a memory device. If the processing device determines not to start the quick scan, the processing device returns to operation 602. If the processing device determines to start the quick scan, the processing device advances to operation 616.

At operation 616, the processing device determines whether all block types have been scanned by the quick scan. To do this, the processing device can read the value of one or more flag variables associated with the blocks or block types of the memory device. If the processing device determines that all blocks have been scanned, the processing device advances to operation 612. At operation 612, the processing device enables a conventional full media scan and initiates folding operations for blocks that have been added to a fold list. Portions of operation 612 can be performed concurrently or in parallel. Also, blocks that have been added to the fold list can be excluded from the full media scan of operation 612.

If the processing device determines that all blocks have not been scanned, the processing device advances to operation 604. At operation 604, the processing device selects a block type to scan using the quick scan. To do this, the processing device can execute one or more of the operations described above with reference to FIG. 2 for grouping and prioritizing blocks according to block type.

At operation 606, the processing device selects, for the block type selected in operation 604, a block to scan using the quick scan. To do this, the processing device can execute one or more of the operations described above with reference to FIG. 2 for sorting blocks of a particular block type.

At operation 608, the processing device selects, for the block selected in operation 606, a page to scan using the quick scan. To do this, the processing device can execute one or more of the operations described above with reference to FIG. 3 for determining a subset of pages of a block to be scanned using the quick scan.

At operation 618, the processing device determines whether to conduct the quick scan on the page selected in operation 608. To do this, the processing device can execute one or more of the operations described above with reference to FIG. 3 for determining whether to scan a page using the quick scan. If the processing device determines not to scan the page, the processing device advances to operation 622.

If the processing device determines to scan the page, the processing device advances to operation 620. At operation 620, the processing device scans the page that was determined to be scanned in operation 618 and determines whether to fold the block that contains the page that was determined to be scanned in operation 618. To do this, the processing device can execute one or more of the operations described above with reference to FIG. 4 for determining whether a page has a fold condition.

If the processing device determines to fold the block, the processing device advances to operation 610. At operation 610, the processing device adds the block to the fold list as part of the quick scan, without folding the block as part of the quick scan. To do this, the processing device can execute one or more of the operations described above with reference to FIG. 5 for adding a block to a fold list.

If the processing device determines not to fold the block or after adding the block to the fold list, the processing device advances to operation 622. At operation 622, the processing device determines whether the processing device is done scanning pages for the block selected in operation 606. To do this, the processing device can determine whether there are any remaining pages to be scanned for the block selected in operation 606. If the processing device determines that there is at least one page remaining to be scanned for the selected block, the processing device returns to operation 608.

If the processing device determines that there are no more pages remaining to be scanned for the selected block, the processing device advances to operation 624. At operation 624, the processing device determines whether all blocks of the block type selected in operation 604 have been scanned. To do this, the processing device can determine whether there are any remaining blocks of the selected block type to be scanned. If the processing device determines that there is at least one block of the selected block type remaining to be scanned, the processing device returns to operation 606. If the processing device determines that no more blocks of the selected block type remain to be scanned, the processing device returns to operation 616.

Figure 7:
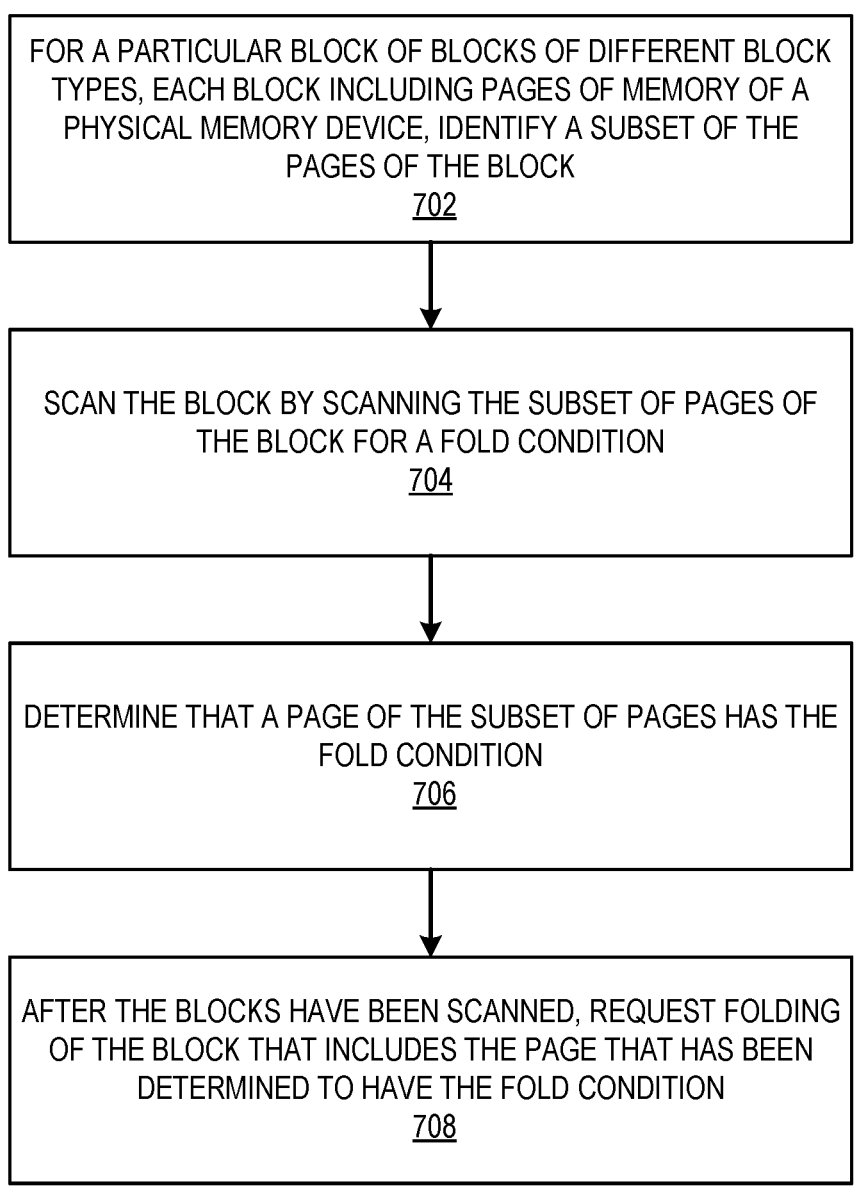
FIG. 7 is a flow diagram of another example method to execute a quick reliability scan for memory in accordance with some embodiments of the present disclosure.

FIG. 7 is a flow diagram of an example method 700 to perform a quick reliability scan of a memory device, in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the quick scanner component 112 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

To perform the method 700, the processing device can execute one or more of the operations shown in FIG. 2, FIG. 3, FIG. 4, and FIG. 5, described above.

At operation 702, the processing device initiates a quick scan for a physical memory device that includes a set of blocks that includes two or more blocks of different block types, where each block includes pages of memory. For a particular block of the set of blocks, the processing device identifies a subset of the pages of the block. To perform operation 702, the processing device can execute one or more of the operations shown in FIG. 2 and/or FIG. 3, described above.

Operation 702 can include the processing device reading quick scan trigger data. An example of quick scan trigger data is a value of the quick scan start time parameter described above. Another example of quick scan trigger data is detection of the occurrence of an event, such as completion of a PCT.

Operation 702 can include the processing device determining whether a quick scan is triggered by evaluating the quick scan trigger data. For example, the processing device can compare a value of the quick scan start time parameter to a current elapsed clock time since power-up of a memory device. As another example, operation 702 can include the processing device detecting an occurrence of a trigger condition by detecting a completion of a power-up operation, detecting a completion of a qualification test, detecting an elapse of a time delay after a power-up operation, or any combination of the foregoing.

Operation 702 can include grouping the blocks in the set of blocks according to a block grouping retention risk factor; for each block group, sorting the blocks of the block group by a block sorting retention risk factor; identifying the subset of pages of the block based on a page scanning risk factor; and determining that the page has the fold condition based on a page retention risk factor.

At operation 704, the processing device scans the block by scanning the subset of pages of the block identified in operation 702 for a fold condition. To perform operation 704, the processing device can execute one or more of the operations shown in FIG. 4, described above.

At operation 706, the processing device determines that a page of the subset of pages scanned in operation 704 has the fold condition and adds a block containing the page that has the fold condition to a fold list. To perform operation 706, the processing device can execute one or more of the operations shown in FIG. 5, described above.

Operation 706 can include, in response to determining that a page has the fold condition, skipping scanning of at least one other page of the subset of pages and/or in response to determining that another block of the two or more blocks does not need to be folded, skipping scanning of the subsets of pages of the remaining unscanned blocks of the two or more of blocks.

At operation 708, after the blocks have been scanned in operation 704, the processing device requests folding of the block that includes the page that has been determined in operation 706 to have the fold condition. At operation 708, the processing device can determine whether the quick scan has completed before requesting folding of the block. To do this, the processing device can determine that all blocks have been scanned using the quick scan or that there are no blocks remaining to be scanned by the quick scan. If the processing device determines that the quick scan is not completed, the processing device can continue scanning blocks. If the processing device determines that the quick scan is completed, the processing device can enable a full media scan.

Operation 708 can include determining a time limit for completion of the scanning of the blocks and causing the scanning of the plurality of blocks to complete within the time limit. An example of a time limit is the quick scan freq parameter described above.

Figure 8:
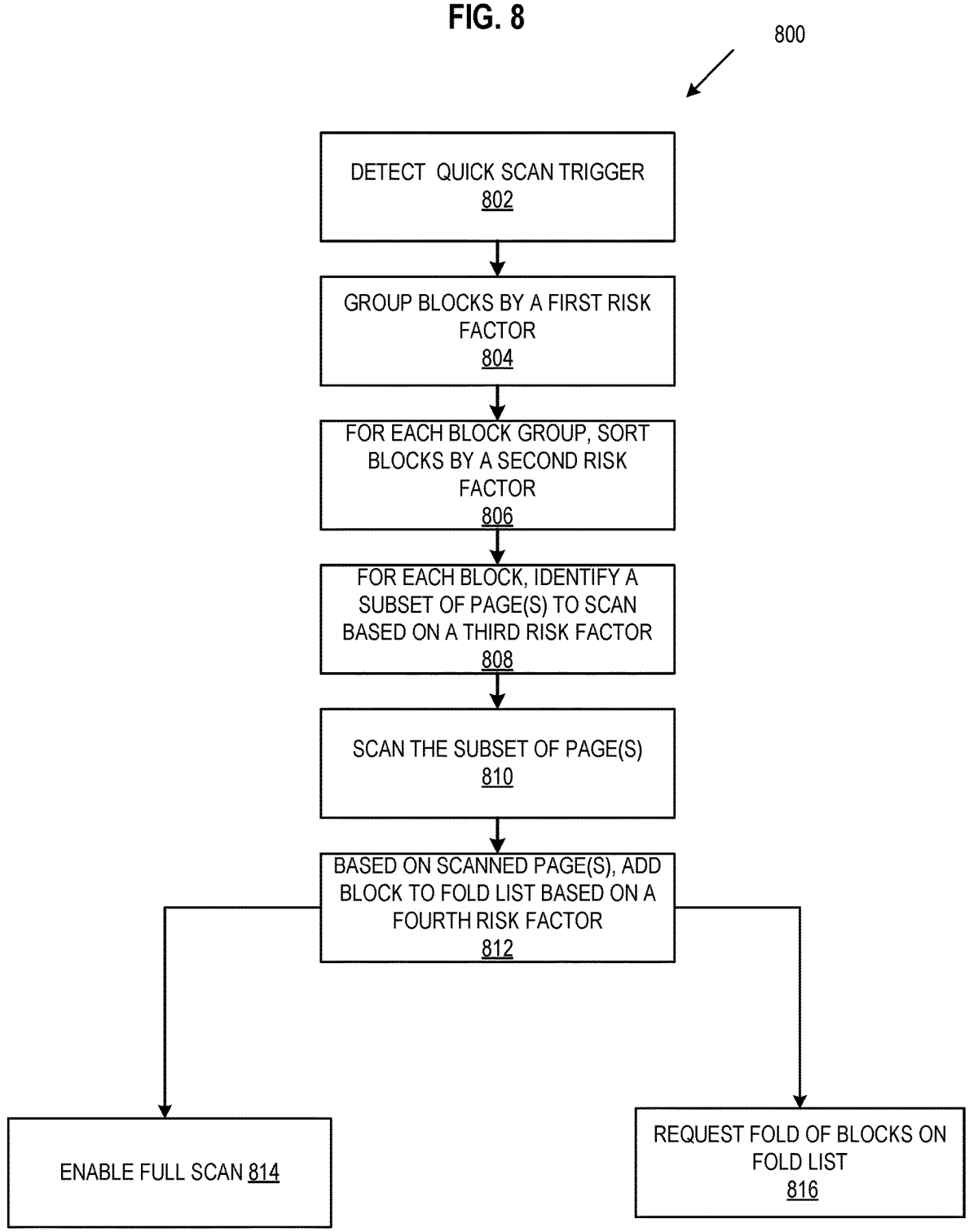
FIG. 8 is a flow diagram of another example method to execute a quick reliability scan for memory in accordance with some embodiments of the present disclosure.

FIG. 8 is a flow diagram of an example method 800 to perform a quick reliability scan of a memory device, in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the quick scanner component 112 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 802, the processing device detects an occurrence of a trigger condition for a quick scan. To do this, the processing device can detect a completion of a power-up operation, detect a completion of a qualification test, detect an elapse of a time delay after a power-up operation, or any combination of the foregoing. The time delay after a power-up operation can be a function of a power cycle test (PCT) cycle time.

At operation 804, the processing device, for a physical memory device that includes blocks of different block types, and each block includes pages of memory, groups the blocks by a first criterion or retention risk factor. The first retention risk factor can correspond to a block type. Grouping the blocks by the first retention risk factor can cause open cursor blocks to be scanned before other block types. The processing device can execute one or more of the operations described above with reference to FIG. 2 for grouping and prioritizing blocks according to block type.

At operation 806, the processing device, for each block group, sorts the blocks of the block group by a second criterion or retention risk factor. The second risk retention factor can include a block age, a block version, a slow charge loss (SCL) bin, or any combination of the foregoing. The processing device can execute one or more of the operations described above with reference to FIG. 2 for sorting blocks of a particular block type.

At operation 808, the processing device, for a block, identifies a subset of the pages of the block based on a third criterion or retention risk factor. The third risk retention factor can include NAND characterization data. The processing device can execute one or more of the operations described above with reference to FIG. 3 for determining a subset of pages of a block to be scanned using the quick scan.

At operation 810, the processing device scans the subset of pages for a fold condition. The processing device can execute one or more of the operations described above with reference to FIG. 4 for determining whether a page has/satisfies a fold condition.

At operation 812, the processing device determines that a page of the subset of pages has the fold condition based on a fourth criterion or retention risk factor and adds the block that contains the page that has the fold condition to a fold list. To add the block that contains the page that has the fold condition to the fold list, the processing device can include changing a value of a flag variable associated with the block. The fourth risk retention factor can include, if the page is programmed, at least one of a residual bit error rate (RBER) and a Voltage distribution metric, or, if the page is not programmed, error state check data. The processing device can execute one or more of the operations described above with reference to FIG. 5 for adding a block to a fold list.

At operation 814, the processing device enables a full media scan after the blocks have been scanned for the fold condition. At operation 816, the processing device requests folding of the blocks identified by the fold list to be folded. The processing device can perform operations 814 and 816 concurrently or in parallel, or sequentially.

Figure 9:
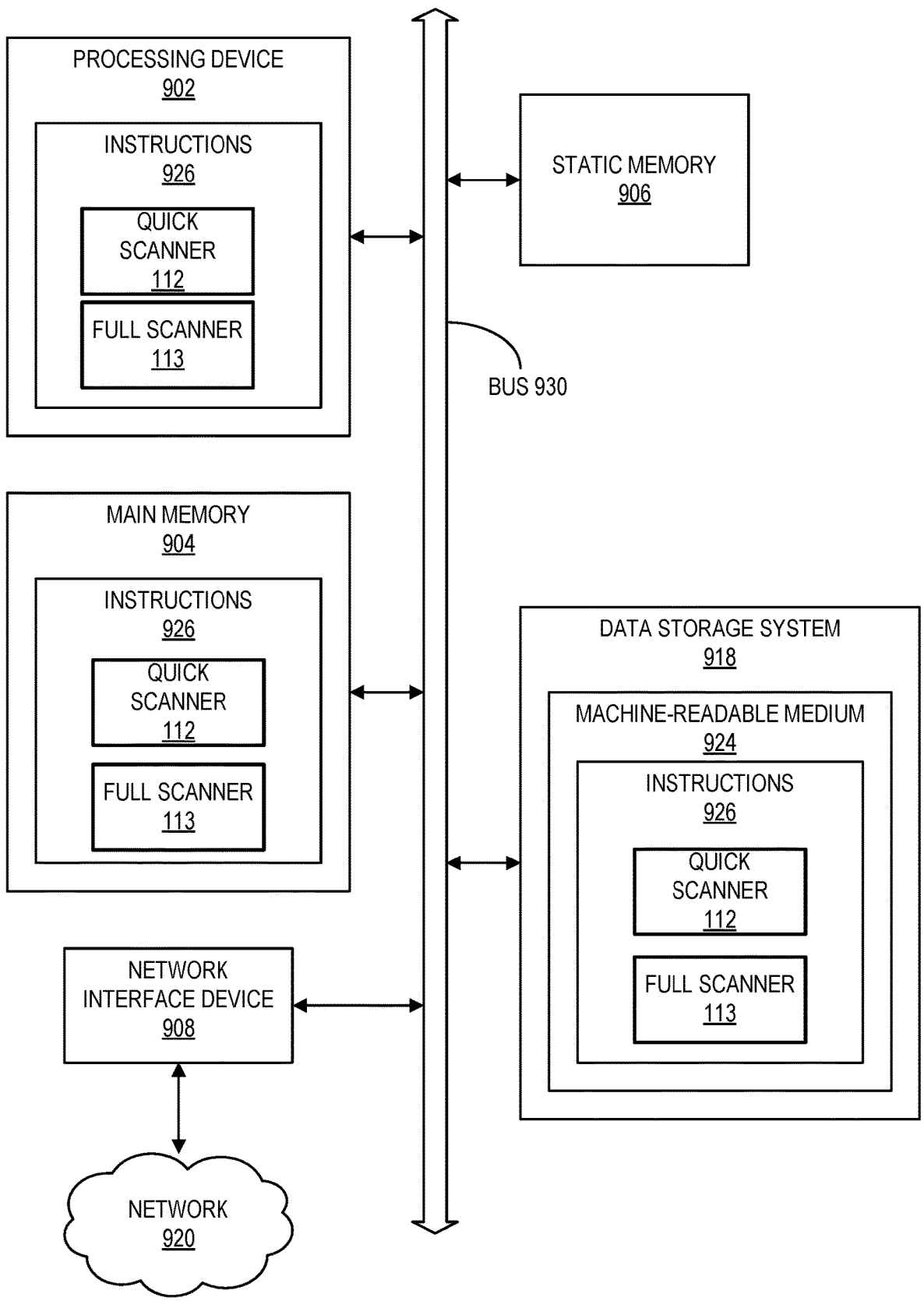
FIG. 9 is a block diagram of an example computer system in which embodiments of the present disclosure can operate.

FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the quick scanner component 112 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random-access memory (DRAM) such as synchronous DRAM (SDRAM) or Rambus DRAM (RDRAM), etc.), a static memory 906 (e.g., flash memory, static random-access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920.

The data storage system 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory subsystem 110 of FIG. 1.

In one embodiment, the instructions 926 include instructions to implement functionality corresponding to a quick scanner component (e.g., the quick scanner component 112 of FIG. 1). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, can carry out the computer-implemented methods 600, 700, and 800 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a non-transitory machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
for a block of a plurality of blocks of a plurality of different block types, each block comprising a plurality of pages of memory of a physical memory device, identifying a subset of the plurality of pages of the block, wherein the subset of the plurality of pages includes a number of pages less than a total number of pages of the block;
scanning the block by only scanning the subset of the plurality of pages of the block for a fold condition;
determining that a page of the subset of the plurality of pages has the fold condition; and
after the plurality of blocks has been scanned, requesting folding of the block in response to determining the page has the fold condition.

2. The method of claim 1, further comprising detecting an occurrence of a trigger condition by (i) detecting a completion of a power-up operation, (ii) detecting a completion of a qualification test, (iii) detecting an elapse of a time delay after a power-up operation, or (iv) at least two of (i), (ii), and (iii).

3. The method of claim 1, further comprising determining a time limit for completion of the scanning of the plurality of blocks and causing the scanning of the plurality of blocks to complete within the time limit.

4. The method of claim 1, further comprising skipping scanning of at least one other page of the subset of the plurality of pages in response to determining that the page has the fold condition.

5. The method of claim 1, further comprising skipping scanning of the subsets of the plurality of pages of the remaining unscanned blocks of the plurality of blocks in response to determining that a second block of the plurality of blocks does not need to be folded.

6. The method of claim 1, further comprising:
grouping the plurality of blocks according to a first retention risk factor;
for each block group, sorting the blocks of the block group by a second retention risk factor;
identifying the subset of the plurality of pages of the block based on a third retention risk factor; and
determining that the page has the fold condition based on a fourth retention risk factor.

7. The method of claim 1, further comprising:
in response to scanning the plurality of blocks for the fold condition by only scanning a subset of the plurality of pages in each block, enabling a full scan that scans each page of each block of the plurality of blocks.

8. A non-transitory computer-readable medium storing instructions, which when executed by a processing device, cause the processing device to:
for a block of a plurality of blocks of a plurality of different block types, each block comprising a plurality of pages of memory of a physical memory device, identify a subset of the plurality of pages of the block, wherein the subset of the plurality of pages includes a number of pages less than a total number of pages of the block;
scan the block by only scanning the subset of the plurality of pages of the block for a fold condition;
determine that a page of the subset of the plurality of pages has the fold condition; and
after the plurality of blocks has been scanned, request folding of the block in response to determining the page has the fold condition.

9. The non-transitory computer-readable medium of claim 8, wherein the instructions further cause the processing device to detect an occurrence of a trigger condition by (i) detecting a completion of a power-up operation, (ii) detecting a completion of a qualification test, (iii) detecting an elapse of a time delay after a power-up operation, or (iv) at least two of (i), (ii), and (iii).

10. The non-transitory computer-readable medium of claim 8, wherein the instructions further cause the processing device to determine a time limit for completion of the scanning of the plurality of blocks and causing the scanning of the plurality of blocks to complete within the time limit.

11. The non-transitory computer-readable medium of claim 8, wherein the instructions further cause the processing device to skip scanning of at least one other page of the subset of the plurality of pages in response to determining that the page has the fold condition.

12. The non-transitory computer-readable medium of claim 8, wherein the instructions further cause the processing device to skip scanning of the subsets of the plurality of pages of the remaining unscanned blocks of the plurality of blocks in response to determining that a second block of the plurality of blocks does not need to be folded.

13. The non-transitory computer-readable medium of claim 8, wherein the instructions further cause the processing device to:
group the plurality of blocks according to a first retention risk factor;
for each block group, sort the blocks of the block group by a second retention risk factor;
identify the subset of the plurality of pages of the block based on a third retention risk factor; and
determine that the page has the fold condition based on a fourth retention risk factor.

14. The non-transitory computer-readable medium of claim 8, wherein the instructions further cause the processing device to:
in response to scanning the plurality of blocks for the fold condition by only scanning a subset of the plurality of pages in each block, enable a full scan that scans each page of each block of the plurality of blocks.

15. A system comprising:
a memory component; and
a processing device, coupled to the memory component, configured to, for a physical memory device comprising a plurality of blocks of a plurality of different block types, each block including a plurality of pages of memory:
for a block of the plurality of blocks, identify a subset of the plurality of pages of the block, wherein the subset of the plurality of pages includes a number of pages less than a total number of pages of the block;
scan the block by only scanning the subset of the plurality of pages of the block for a fold condition;
determine that a page of the subset of the plurality of pages has the fold condition;
after the plurality of blocks has been scanned, request folding of the block in response to determining the page has the fold condition; and
in response to scanning the plurality of blocks for the fold condition by only scanning a subset of the plurality of pages in each block, enabling a full scan that scans each page of each block of the plurality of blocks.

16. The system of claim 15, wherein the processing device is further configured to detect an occurrence of a trigger condition by (i) detect a completion of a power-up operation, (ii) detecting a completion of a qualification test, (iii) detecting an elapse of a time delay after a power-up operation, or (iv) at least two of (i), (ii), and (iii).

17. The system of claim 15, wherein the processing device is further configured to determine a time limit for completion of the scanning of the plurality of blocks and causing the scanning of the plurality of blocks to complete within the time limit.

18. The system of claim 15, wherein the processing device is further configured to skip scanning of at least one other page of the subset of the plurality of pages in response to determining that the page has the fold condition.

19. The system of claim 15, wherein the processing device is further configured to skip scanning of the subsets of the plurality of pages of the remaining unscanned blocks of the plurality of blocks in response to determining that a second block of the plurality of blocks does not need to be folded.

20. The system of claim 15, wherein the processing device is further configured to:
group the plurality of blocks according to a first retention risk factor;
for each block group, sort the blocks of the block group by a second retention risk factor;
identify the subset of the plurality of pages of the block based on a third retention risk factor; and determine that the page has the fold condition based on a fourth retention risk factor.

* * * * *